US006824753B2

(12) United States Patent
Paine et al.

(10) Patent No.: US 6,824,753 B2
(45) Date of Patent: Nov. 30, 2004

(54) ORGANOBORON ROUTE AND PROCESS FOR PREPARATION OF BORON NITRIDE

(75) Inventors: Robert T. Paine, Albuquerque, NM (US); William J. Kroenke, Albuquerque, NM (US); Eugene A. Pruss, Hamburg, NY (US); Gary L. Wood, Valdosta, GA (US); Jerzy F. Janik, Woj. Malopolskie (PL)

(73) Assignee: Science & Technology Corporation @UNM, Albuquerque, NM (US)

( * ) Notice: Subject to any disclaimer, the term of this patent is extended or adjusted under 35 U.S.C. 154(b) by 304 days.

(21) Appl. No.: 10/131,301

(22) Filed: Apr. 23, 2002

(65) Prior Publication Data

US 2002/0155052 A1 Oct. 24, 2002

Related U.S. Application Data

(60) Provisional application No. 60/286,275, filed on Apr. 25, 2001, and provisional application No. 60/374,966, filed on Apr. 22, 2002.

(51) Int. Cl.[7] .................. C01B 35/10; C01B 21/064
(52) U.S. Cl. ........................................ 423/277; 423/290
(58) Field of Search ............................ 423/277, 290

(56) References Cited

U.S. PATENT DOCUMENTS

| 2,629,732 A | 2/1953 | Schechter |
| 2,824,787 A | 2/1958 | May et al. |
| 3,352,637 A | 11/1967 | Heymer et al. |
| 3,711,594 A | 1/1973 | Bienert et al. |
| 4,784,978 A | 11/1988 | Ogasawara et al. |
| 4,971,779 A | 11/1990 | Paine, Jr. et al. |
| 6,348,179 B1 | 2/2002 | Paine et al. |
| 6,652,822 B2 * | 11/2003 | Phillips et al. ............... 423/290 |

FOREIGN PATENT DOCUMENTS

| DE | 2004360 | 8/1971 |
| DE | 1943581 | 3/1972 |
| DE | 1943582 | 3/1972 |
| EP | 0 396 448 A1 | 11/1990 |
| JP | 60-200811 A | 3/1984 |
| JP | 60 200811 | 10/1985 |

OTHER PUBLICATIONS

Bienert, K., et al., Abstract of German Patent 1,943,581 as published in Industrial Inorganic Chemicals, vol. 74, No. 101255v (1971).

Bienert, K., et al., Abstract of German Patent 1,943,582 as published in Industrial Inorganic Chemicals, vol. 74, No. 1012556w (1971).

Bienert, K., et al., Abstract of German Patent 2,004,360 as published in Industrial Inorganic Chemicals, vol. 75, No. 1029081 (1971).

Goubeau, J., et al., . Anorg. Allgem. Chem., vol. 266, pp 1561–280 (1951) w/ English translation.

Lappert, M.F., Chem. Rev., vol. 56, pp 959–975 and 1056–1064 (1956).

(List continued on next page.)

Primary Examiner—Wayne A. Langel
(74) Attorney, Agent, or Firm—Katy C. Fain; Mays & Fain, LLP (57) ABSTRACT

An organoboron route and process for preparation of boron nitride utilizing aerosol assisted vapor phase synthesis (AAVS) wherein organoboron precursors are nitrided in one or two heating steps, and wherein a boron oxide nitride intermediary composition is formed after the first heating step and may be further nitrided to form resultant spheroidal boron nitride powders including spheroidal particles that are smooth, bladed, have protruding whiskers, and are of turbostratic or hexagonal crystalline structure.

53 Claims, 7 Drawing Sheets

OTHER PUBLICATIONS

Lindquist, D.A., et al., "Boron Nitride Powders Fromed by Aerosol Decomposition of Poly(borazinylamine) Solutions," *J. Am. Ceram. Soc.,* vol. 74, No. 12 (2136–2128 (1991).

Murakawa, N., et al., Abstract "Boron Nitride Manufacture," Jpn Kokai Tokkyo Koho Japanese Patent JP60.2000.811 (Oct. 11, 1985).

Paine, R. T., et al., "Synthetic Routes to Boron Nitride," *Chem. Rev.,* vol. 90, pp 73–01 (1990).

Pruss, E.A., et al., "Aerosol Assisted Vapor Systhesis of Spherical Boron Nitride Powders," *Chemistry of Materials,* vol. 12, No. 1, pp 19–21 (2000).

Steinberg, H., *Organoboron Chemistry* TEXTBOOK, J. Wiley and Sons, Ch 4, pp 124–125, 129, 191, 204–205, 212–212.

Wade, B., et al., "Synthesis and Characterization of Processable Polyborate Precursors," *J. of Sol–Gel Sci and Tech.,* vol. 5, pp 15–25 (1995).

* cited by examiner

ORGANOBORON ROUTE AND PROCESS FOR PREPARATION OF BORON NITRIDE

CROSS-REFERENCE TO RELATED APPLICATIONS

This application claims the benefit of the filing of U.S. Provisional Patent Application Ser. No. 60/286,275, entitled "Organoboron Routes to Boron Nitride", filed on Apr. 24, 2001, and the specification thereof is incorporated herein by reference. This application also claims the benefit of a U.S. Provisional Patent Application Ser. No. 60/374,966 filed on Apr. 22, 2002, entitled "Non-aqueous Borate Route to Boron Nitride", for this same applicant and for which a serial number has not yet been obtained, and the specification thereof is incorporated herein by reference.

GOVERNMENT RIGHTS

The U.S. Government has a paid-up license in this invention and the right in limited circumstances to require the patent owner to license others on reasonable terms as provided for by the terms of Contract Nos. CHE 9508668 and CHE 99883205 awarded by the National Science Foundation.

BACKGROUND OF THE INVENTION

1. Field of the Invention (Technical Field)

The present invention relates to a process for production of boron nitride powders exhibiting smooth spherical morphology, spheroidal particles with "bladed" surface morphology, spheroidal particles with protruding "whiskers," and fully "bladed" particles with platelet morphology, and particles having turbostratic or hexagonal crystal structure. The process utilizes aerosol assisted vapor phase synthesis (AAVS), nitriding organoboron precursors through a boron oxide nitride intermediary composition, to form spherical and modified spherical boron nitride powders. The process can be achieved through use of an aerosol assisted vapor phase reactor system (AAVRS), and it has significant use in preparation of the preferred spheroidal boron nitride powders for use in the microelectronic, polymer, and cosmetic industries as well as in traditional ceramic markets (e.g., aerospace and automotive products).

2. Background Art

Boron nitride (BN) is a well-known, commercially produced refractory non-oxide ceramic material. Boron nitride properties are highly dependent on its crystalline structure. The most common structure for BN is a hexagonal crystal structure. This structure is similar to the carbon structure for graphite, consisting of extended two-dimensional layers of edge-fused six-membered $(BN)_3$ rings. The rings arrange in crystalline form where B atoms in the rings in one layer are above and below N atoms in neighboring layers and vice versa (i.e., the rings are shifted positionally with respect to layers). The intraplanar B—N bonding in the fused six-membered rings is strongly covalent while the interplanar B—N bonding is weak, similar to graphite.

Historically, commercial boron nitride articles have been prepared by hot pressing BN powders obtained from classical metallurgical high-temperature synthesis (e.g., boric acid treated with urea at 1000° C., "hot-pressed BN"; or BN obtained by chemical vapor deposition (CVD) growth, "pyrolytic BN"). Pyrolytic BN is considered the more typical form in the industry, given the absence of binders and improved crystallinity and grain features. (Unless otherwise indicated, properties of BN described in these background materials are representative of pyrolytic BN.) Under these typical solid state synthesis conditions, BN is typically obtained as a mixture of meso-graphitic and turbostratic modifications that contain varying degrees of disorder of the ideal hexagonal BN structure (h-BN). Fully ordered h-BN is only obtained with careful attention to synthetic detail. (Paine, RT, Narula, CK. Synthetic Routes to Boron Nitride. Chem. Rev. 90: 73–91, 1990.)

Commercial applications for h-BN are well established in several traditional ceramic markets. In particular, the high temperature stability, chemical inertness, lubricity, electrical resistivity and thermal conductivity make BN powders ideal for fabrication of products used in aerospace, automotive and microelectronic products, including large crucibles, heat sinks, mold liners and electrical insulators. Unlike carbon, h-BN is a colorless or (in cases where impurities are present with defect states in the electronic band gap) white material. In its powder form, it can be processed by classical powder forming methods into simple and complex shapes. Since it is soft, hot pressed bodies can be easily machined. In the absence of oxygen and moisture, BN is stable above 2000° C.; however, it combusts in oxygen near 900° C. The layered, hexagonal crystal structure results in anisotropic physical properties that make this material unique in the overall collection of non-oxide ceramics.

Examples of various known or attempted methods to produce spheroidal BN through hexagonal modification include several high-temperature, metallurgical or chemical vapor deposition (CVD) reactions. (Paine, RT, Narula, CK. Synthetic Routes to Boron Nitride. Chem. Rev. 90: 73–91, 1990.) From the commercial standpoint, h-BN is obtained as a powder most often from multi-step processes that employ boric oxide, sodium borate or boric acid as the boron raw material and urea, melamine and/or ammonia as the nitriding source. These reactions are driven by the thermodynamic stability of BN and the reducing nitridation conditions that remove impurities.

Carbothermal reduction conditions also can be employed to remove oxygen. Commercial powder producers manipulate reaction conditions in order to achieve target powder purity, grain size, sinterability and crystallinity. These features, in turn, influence powder processibility and finished product performance. It is important to note that commercial powders are usually obtained either as agglomerates having irregular morphology or as primary particles with a platelet morphology. The latter is a macroscopic manifestation of the inherent crystal structure of h-BN.

Recently, interest in inorganic ceramic/organic polymer composites containing BN powders for thermal management applications has arisen. It has been suggested in the art that a spherical morphology BN powder would be useful to enhance powder processing of polymers. However, a commercial source of such powders is not available. One known process to obtain small, laboratory-scale samples of spheroidal BN involves reacting trichloroborazine with an aminosilane to form a polymer that dissolves in liquid ammonia $(NH_3)$. The resulting solution may be used to form an aerosol containing poly(borazinylamine). The aerosol is then passed through a reaction furnace to produce a boron nitride powder composed of primary particles having spherical morphology. Further nitridation in an $NH_3$ atmosphere at a temperature of 1600° C., over a period of time of at least eight hours, gives h-BN particles of overall spheroidal shape with protruding non-uniform blades. This process is not commercially viable since it requires the use of an expensive, commercially unavailable polymer that is made only from an expensive commercially unavailable monomer.

(Lindquist, DA et al. Boron Nitride Powders Formed by Aerosol Decomposition of Poly(borazinylamine) Solutions. *J. Am. Ceram. Soc.* 74 (12) 3126–28, 1991.)

As another example, a second method reacts boron trichloride with ammonia, a combination typically used to make platelet morphology h-BN by CVD. The resulting powders are treated at high temperature in a graphite furnace under vacuum. (The patent suggests formation of spherical primary particles although no evidence of the actual morphology is provided.) This process, if successful, is not commercially attractive due to the expense of the starting material, $BCl_3$, and the formation of a corrosive by-product HCl that tends to leave chloride impurities in powders. (European Patent Office Publication No. 0 396 448.)

A third and potentially more practical process for the formation of spherical morphology h-BN powders utilizes a process where an aerosol is generated from a saturated (0.9M) aqueous solution of boric acid. The aerosol is passed into a heated tubular reactor where it is nitrided by $NH_3$ in a temperature range of between 600° C. and 1500° C., preferably between 1000° C. and 1200° C. A powder product, $BN_xO_y$, is collected that contains significant amounts of oxygen, typically between 40 wt. % to 55 wt. %. The primary particles have spherical particle diameters in the range 0.1 micron to 5 microns. These powders are subsequently nitrided in a second stage in a temperature range of between 1000° C. to 1700° C. under a flowing stream of $NH_3$. The oxygen contents of the resulting boron nitride powders are less than 4 wt. % and the particles retain the spherical morphology. (Pruss et al., Aerosol Assisted Vapor Synthesis of Spherical Boron Nitride Powders. *Chem. Mater.* 12(1), 19–21, 2000; U.S. Pat. No. 6,348,179 to Pruss et al.)

Although the process described by Pruss et al. is practically useful for the production of spherical morphology BN powders, it possesses several drawbacks, including: (a) large amounts of water are injected into the tubular reaction zone in the form of aerosol droplets thereby diluting the $NH_3$ reactant that is required for nitridation of $H_3BO_3$ dissolved in the aqueous aerosol droplets; (b) the large amounts of injected water act as a back-reactant with $BN_xO_y$ aerosol powders; (c) water is also formed as a reaction byproduct in the first stage aerosol nitridation; (d) the $BN_xO_y$ powders formed in the first-stage nitridation reaction contain large amounts of oxygen; (e) the large amounts of oxygen are difficult to remove in the second-stage nitridation; and (f) there is significant loss of boron as a volatile component during the nitridation process. Due to these drawbacks alternative solventless or non-aqueous solvent-based aerosol chemical systems have been sought in the industry.

Very few readily available, inexpensive boron reagents exist that are soluble in a non-aqueous solvent appropriate for aerosol formation or aerosol pyrolysis. Similarly, there are very few inexpensive, liquid-phase boron reagents that might be employed directly without a solvent to generate an aerosol. However, at least one family of boron reagents does exist that is commercially available in large quantities at relatively low cost and is soluble in non-aqueous solvents: trialkoxyboranes or trialkylborates, $(RO)_3B$ (e.g., R=Me ($CH_3$), Et($C_2H_5$), Pr($C_3H_3$), Bu($C_4H_9$)). These are free-flowing liquids at 23° C. In addition, there is evidence in the literature that suggests that trialkylborates, $(RO)_3B$, react with the common nitriding reagent ammonia, $NH_3$.

For example, U.S. Pat. No. 2,629,732, discloses that $(RO)_3B$ (R=lower mol. wt. alkyl groups preferably $CH_3$) reacts with $NH_3$ in a 1:1 ratio in the gas phase at normal atmospheric pressure and temperature to give adducts, $(RO)_3B.NH_3$. Further, other examples in the literature describe a reaction of $(CH_3O)_3B$ with $NH_3$ that is claimed to form an adduct $(MeO)_3B.NH_3$ that sublimes at 45° C. and allegedly is stable to at least 375° C. (Goubeau et al., *Z. Anorg. Allgem. Chem.* 266, 161–174, 1951.) Goubeau et al. also describe reactions that employ other reactant ratios which produce complex product mixtures that are not identified. The chemistry is proposed to involve elimination of methanol and dimethyl ether. U.S. Pat. No. 2,824,787 to May et al. claims the formation of BN from pyrolysis of a gas mixture of $(MeO)_3B$ and $NH_3$ at a furnace temperature above about 850° C. The resulting product is a white powder containing B, N, O, C, and H in varying amounts depending upon reaction conditions. This powder is then heated in $NH_3$ atmosphere to 900°–1100° C. to obtain BN. The '787 patent does not describe the morphology and crystallinity of the BN. However, it is likely that these processes produce BN with the traditional platelet morphology.

Further, in a series of patents, Bienert et al. describe the formation of boron-nitrogen-hydrogen compounds, $BN_{3-x}H_{6-3x}$, from the reaction of boron halides or basic acid esters with $NH_3$ in a heated gas flow tube held at 200° C. or 500° C. The resulting compounds are claimed to be useful for making detrition-resistant boron nitride pressed bodies, boron nitride powder and semiconduction components. (Bienert et al., Ger. Offen. No. 1,943,581; Ger. Offen. No. 1,943,582; Ger. Offen. No. 2,004,360; U.S. Pat. No. 3,711,594.) Finally, Murakawa et al. describe the use of $(EtO)_3B$ in a hot gas stream of air and methane to form $B_2O_3$ and C. A powder compact was subsequently heated at 900° C. in $N_2$. It was claimed that h-BN with spherical morphology (ave. diameter, approximately 0.14 micron) formed. (Japanese Patent No. JP60,200,811 to Kokai et al.)

There remains a real need in the art for a process yielding spherical h-BN in high concentration without high oxygen impurities, utilizing commonly available, inexpensive precursors such as trialkylborates.

SUMMARY OF THE INVENTION (DISCLOSURE OF THE INVENTION)

The present invention is a method for an aerosol assisted vapor phase synthesis (AAVS) process of boron nitride (BN) wherein organoboron precursors are nitrided in one or two heating steps, and wherein a boron oxide nitride intermediary composition is formed after the first heating step and is further nitrided to form resultant spheroidal boron nitride powders including spheroidal particles that are smooth, bladed, have protruding whiskers, and are of turbostratic or hexagonal crystalline structure.

The method of the present invention comprises forming a boron-nitrogen-oxygen-carbon-hydrogen, $BN_xO_yC_z$, precursor for BN comprising: providing an organoboron precursor, an inert carrier gas, and a nitriding agent; aerosolizing the precursor; introducing the carrier gas into a chamber containing the aerosolized precursor and forming a combined gas stream; sweeping the combined gas stream into a heated furnace; injecting the nitriding agent into the furnace; allowing the nitriding agent and aerosolized precursor to react to form a powder of a boron-nitrogen-oxygen-carbon-hydrogen composition; and collecting the powder.

Further steps in the method may be taken as follows:

In the present invention, the nitriding agent and aerosolized precursor are reacted in a first heating step. The resultant boron-nitrogen-oxygen-carbon-hydrogen composition is heated in a second heating step in the presence of a nitriding agent, inert gas, or vacuum.

The nitriding agent may comprise $NH_3$, $N_2/H_2$, $N_2$, alkylamines, hydrazine, cyanamide, dicyanamide, hydroxylamines, or mixtures thereof. The nitriding agent may comprise a liquid, which is aerosolized and is swept into the furnace by a carrier gas.

The organoboron precursor agent may comprise an alkylborate. The alkylborate may comprise a trialkylborate. Further, the trialkylborate may comprise $(MeO)_3B$, $(EtO)_3B$, $(PrO)_3B$, or $(BuO)_3B$. However, the precursor agent may comprise a polyborate. The polyborate may comprise a boroxine. Further, the organoboron precursor may comprises an azeotropic mixture. The azeotropic mixture may comprises an alkylborate and alcohol. The alkylborate may be a trimethylborate and the alcohol may be methanol. The organoboron precursor may be dissolved in simple alcohols, alkanes, or arenes prior to aerosolization, thereby increasing the percentage of carbon in the resulting $BN_xO_yC_z$ powder. Further, the organoboron precursor may be dissolved in liquid ammonia prior to aerosolization.

The aerosolized organoboron precursor and carrier gas, and the nitriding agent are simultaneously swept or injected into the furnace. The flow of the combined gas stream (organoboron precursor and carrier gas) may have a predetermined flow rate. The injection step of the nitriding agent may have a predetermined flow rate.

The step of heating the furnace comprises the step of maintaining a temperature of between approximately 600° C. and approximately 1800° C. Further, the temperature may be maintained between approximately 1200° C. and approximately 1800° C.

The boron-nitrogen-oxygen-carbon-hydrogen powder may be collected on a powder collection device, which may be a filter.

Additional steps of grinding the resultant $BN_xO_yC_z$ powder, spreading the powder over an oxide, and melting the powder over the oxide thereby reacting the powder with the oxide and forming a BN thin film layer may additionally be taken. Further, the $BN_xO_yC_z$ powder may be collected on a substrate and then melted, forming a boron nitride thin film layer.

An method of the present invention comprises preparing h-BN by the following steps: providing an organoboron precursor, an inert carrier gas, and a nitriding agent; aerosolizing the precursor; introducing the carrier gas into a chamber containing the aerosolized precursor and forming a combined gas stream; sweeping the combined gas stream into a heated furnace; injecting the nitriding agent into the furnace; allowing the nitriding agent and aerosolized precursor to react to form a powder of a boron-nitrogen-oxygen-carbon-hydrogen composition during a first heating step; heating the boron-nitrogen-oxygen-carbon-hydrogen composition in a second heating step in the presence of the nitriding agent; allowing the nitriding agent and boron-nitrogen-oxygen-carbon-hydrogen composition to react with the nitriding agent in the second heating step to form a boron-nitrogen powder; and collecting the powder.

Further steps in this method may be taken as follows:

The nitriding agent may comprise $NH_3$, $N_2/H_2$, $N_2$, alkylamines, hydrazine, cyanamide, dicyanamide, hydroxylamines, or mixtures thereof. The nitriding agent may comprise a liquid, which is aerosolized and is swept into the furnace by a carrier gas.

The organoboron precursor agent may comprise an alkylborate. The alkylborate may comprise a trialkylborate. Further, the trialkylborate may comprise $(MeO)_3B$, $(EtO)_3B$, $(PrO)_3B$, or $(BuO)_3B$. However, the precursor agent may comprise a polyborate. The polyborate may comprise a boroxine. Further, the organoboron precursor may comprise an azeotropic mixture. The azeotropic mixture may comprise an alkylborate and an alcohol. The alkylborate may be trimethylborate and the alcohol may be methanol. The organoboron precursor may be dissolved in simple alcohols, alkanes, or arenes prior to aerosolization, thereby increasing the percentage of carbon in the resulting $BN_xO_yC_z$ powder. When the organoboron precursor is dissolved in alcohols, alkanes, or arenes, the resultant BN compound is microporous or nanoporous. Further, the organoboron precursor may be dissolved in liquid ammonia prior to aerosolization.

The aerosolized organoboron precursor and carrier gas, and the nitriding agent are simultaneously swept or injected into the furnace. The flow of the combined gas stream (organoboron precursor and carrier gas) may have a predetermined flow rate. The injection step of the nitriding agent may have a predetermined flow rate.

The step of heating the furnace comprises a first heating step of maintaining a temperature of between approximately 600° C. and approximately 1800° C. Further, the temperature may be maintained between approximately 1200° C. and approximately 1800° C.

The boron-nitrogen-oxygen-carbon-hydrogen powder may be collected on a powder collection device, which may be a filter. The powder may then be placed in a second furnace and subjected to the second heating step in the second furnace. Contrarily, the boron-nitrogen-oxygen-carbon-hydrogen powder may not be collected, but may be vented in a gas stream entrained with the powder into a second furnace before the second heating step.

Both heating steps may be performed in one furnace, which may be a vertical furnace. The second heating step may comprise maintaining the temperature between approximately 600° C. and approximately 1800° C. Further, the temperature may be maintained between approximately 1200° C. and approximately 1800° C.

Modified h-BN particles are formed by varying the aerosol conditions or reactor conditions to form turbostratic structures, bladed spherical particles, platelet particles, or particles having crystalline whisker growth.

The formed BN particles may comprise a diameter range between approximately 0.05 μm and approximately 100 μm.

A primary object of the present invention is preparing a BN powder comprising a spherical morphology.

Another object of the present invention is preparing a BN powder comprising a modified spherical morphology.

Yet another object of the present invention is providing a simple, one or two-step synthesis process for preparation of BN.

Another object of the present invention is to provide a process yielding highly pure levels of h-BN, wherein impurities of such a BN product would comprise additional elements or non-spherical BN particles.

A further object of the present invention is to provide a process utilizing simple organoboron precursors.

Yet another object of the present invention is to provide a simple process for utilizing trialkylborates as a precursor to BN.

A primary advantage of the present invention is preparing a BN powder comprising a spherical morphology.

Another advantage of the present invention is preparing a BN powder comprising a modified spherical morphology.

Yet another advantage is that BN may be prepared in a simple one or two-step process.

Another advantage of the present invention is the use of simple, available, inexpensive organoboron compounds as precursor to BN.

A further advantage is the highly purified h-BN product, wherein impurities of such a BN product would comprise additional elements or non-spherical BN particles.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DESCRIPTION OF THE PREFERRED EMBODIMENTS (Best Modes for Carrying out the Invention)

The present invention is a method for an aerosol assisted vapor phase synthesis (AAVS) process of boron nitride (BN) wherein organoboron precursors are nitrided in one or two heating steps, and wherein a boron oxide nitride intermediary composition is formed after the first heating step and is further nitrided to form resultant spheroidal boron nitride powders including spheroidal particles that are smooth, bladed, have protruding whiskers, and are of turbostratic or hexagonal crystalline structure.

The process of the present invention, forming a boron-nitrogen-oxygen-carbon-hydrogen intermediate composition and forming from such composition the desired spherically shaped or modified spherical BN powder having either a turbostratic (t-BN) or a hexagonal (h-BN) crystal structure, as more particularly described herein, preferably includes the following steps: (1) introducing a liquid boron reagent precursor into an aerosol generator, (2) creating an aerosol of the precursor reagent liquid by using an aerosol generator, (3) using an inert carrier gas to sweep the aerosol droplets generated into a furnace, (4) injecting a gaseous nitriding agent (or a nitriding agent aerosol on a carrier gas) into the furnace, (5) maintaining the temperature of the furnace within a temperature range of approximately 600° C. to approximately 1800° C., and (6) collecting the resultant intermediate, $BN_xO_yC_z$ powder particles. Additional steps of the method may be utilized, including (7) heat-treating the $BN_xO_yC_z$ precursor particles after step 5 or step 6 at approximately 600° C. to approximately 1800° C. under nitriding conditions, and then (8) collecting the fully nitrided particles.

The aerosol assisted vapor phase reactor system apparatus for forming spherical BN as described above typically comprises an aerosol generator (capable of producing an aerosol spray of droplets of the preferred liquid trialkylborate, $(RO)_3B$, precursor compound or a non-aqueous solution of the same), a means for injecting a gas stream composed of liquid reagent droplets in an inert carrier gas into a heated reactor tube at a controlled flow rate, and a means for injecting a gaseous nitriding agent (or liquid nitriding agent on an inert carrier gas) separately into the furnace (preferably substantially simultaneously to the injection of the reagent/carrier gas aerosol).

Figure 1:
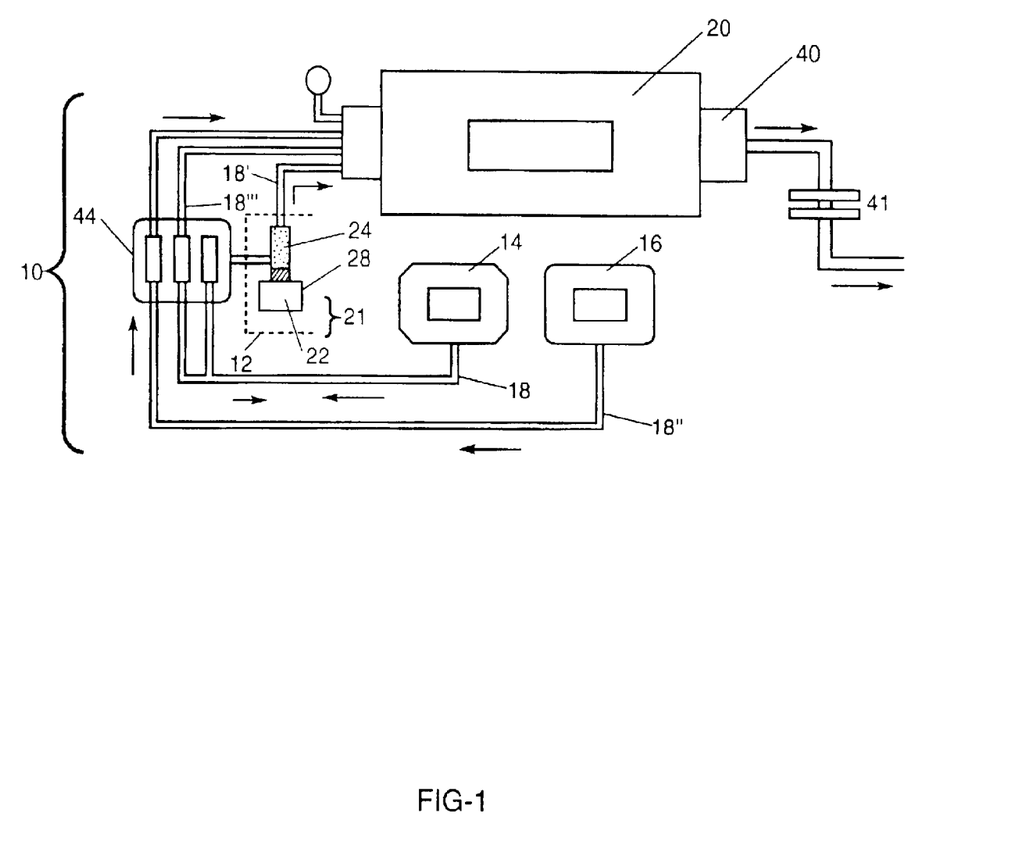
FIG. 1 is schematic diagram of the aerosol assisted vapor phase reactor system (AAVRS) of the present invention.

Turning now to the drawings, a schematic diagram of an aerosol assisted vapor phase reactor system (AAVRS) 10 used in accordance with the method of the present invention is shown in FIG. 1. The AAVRS 10 depicted is a "bench scale" system, but the methods of the present invention additionally apply to an apparatus on a commercial scale. AAVRS 10 comprises aerosol generator assembly 12, inert carrier gas source 14, nitriding source 16, connection systems 18, 18', 18", furnace 20, and preferably collection device 41.

Generator assembly 12 preferably comprises ultrasonic transducer assembly 21. Other generator assemblies may be utilized, including but not limited to spray nozzles, nebulizers, and atomizers. It should be understood that many different aerosol generator geometries may be employed as the droplet generator. The selection of a particular aerosol or droplet generator and droplet delivery system or geometry will preferably depend upon the AAVRS type and size, target droplet size, droplet size distribution, droplet delivery rate and chemical composition of the droplet. For example, an impactor (e.g., barrier) may be inserted in-line in the delivery system to modify the particle size distribution and decrease the delivery rate. Different spray nozzle designs may be employed to vary the size of the droplets and different additives can be added to the $(RO)_3B$ or other organoboron precursor to modify the surface tension of the reagent.

Transducer assembly 21 preferably comprises humidifier base 22, glass chamber 24, diaphragm 26, and ultrasonic transducer 28. Humidifier base 22 contains transducer 28 and may be a preformed commercial unit (e.g., Holmes Model 643B). Water or another suitable liquid fills base 22, contacting both diaphragm 26 and transducer 28.

Figure 2:
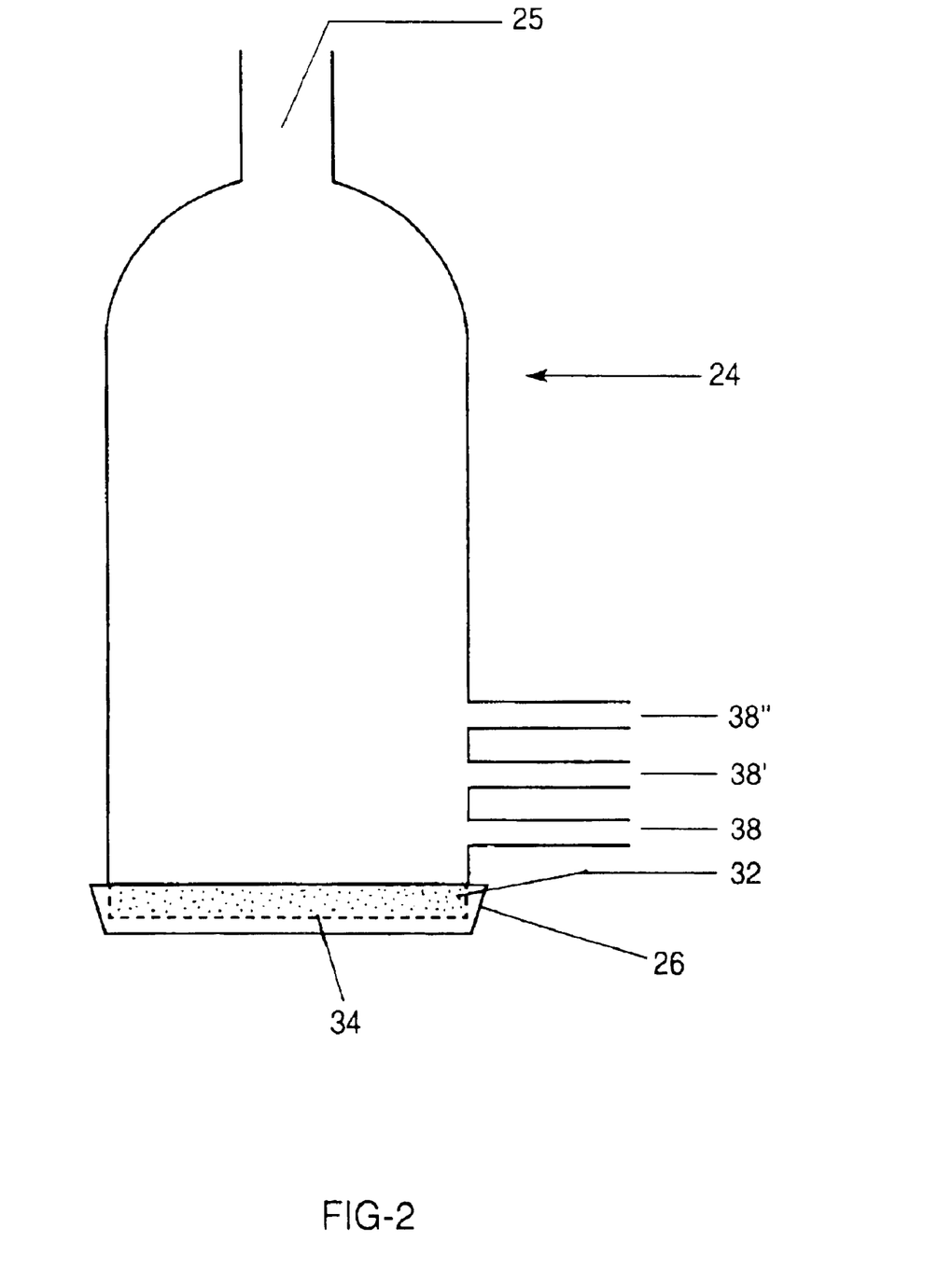
FIG. 2 is schematic of a glass chamber of a generator assembly, depicting an outlet and three inlets.

As best depicted in FIG. 2, glass chamber 24 contains precursor liquid 32 during use. The preferred precursor liquid comprises an alkylborate, most preferably a trialkylborate. It is preferred that a trimethylborate, $(MeO)_3B$, be utilized as the boron precursor liquid for the formation of dense $BN_xO_yC_z$ particles of low O and C content.

Triethylborate, $(EtO)_3B$, triisopropylborate, $(^iPrO)_3B$, and other trialkylborates utilizing simple organic side groups (e.g., $C_1$-$C_4$) may be used in the present invention, and these compounds are preferred for cases where larger C contents can be tolerated or are preferred.

Glass chamber 24 may comprise multiple configurations including, but not limited to the flask shape shown in FIG. 2. Glass chamber 24 comprises at least one outlet 25 in connected relation to connection system 18'. Connection system 18' is disposed between chamber 24 and furnace 20. Glass chamber 24 additionally comprises at least one inlet 38 in connected relation to connection system 18. Connection system 18 is disposed in connected relation between chamber 24 and inert gas source 14. Additional inlets such as inlets 38', 38'' depicted in FIG. 2, may also be utilized to connect additional inert gas sources or for continuous or batch transfer of precursor 32 to chamber 24. Accordingly, multiple lines of connection system 18 may be utilized when multiple inlets or outlets are used.

Diaphragm 26 is preferably comprised of a thin, flexible material such as polyethylene, which has a suitable tension for transmitting ultrasonic energy from an emitter source 28 to liquid precursor 32 contained within glass chamber 24 (See FIGS. 1 and 2). Preferably, diaphragm 26 will also be comprised of a suitably inert material with respect to the utilized precursor. Other polymers may be suitable for the diaphragm material, provided they comprise a suitable tension and are chemically inert to the precursor. As a result, other such materials known in the art may be utilized for the diaphragm. Diaphragm 26 is stretched fittingly over bottom 34 of glass chamber 24, and may be attached with means known in the art, such as but not limited to, a fitted ring. Diaphragm 26 is preferably positioned in relation to transducer 28 for best sonic transmission, preferably with transducer 28 immediately proximate to diaphragm 26 and centrally positioned, but leaving a small gap as is commonly known in the art.

Ultrasonic transducer 28 is mounted in humidifier base 22 and preferably comprises a piezoelectric crystal, but may comprise other transducers known in the art. Transducer 28 is electrically stimulated, thereby creating ultrasonic stimulation of diaphragm 26. Diaphragm 26 transmits the ultrasonic energy to precursor liquid 32, thereby creating an aerosol of precursor liquid 32. Other aerosol generator configurations known in the art may be utilized in performing the methods of the present invention. Additionally, multiple generators may be utilized. However, it is preferred that the amount of aerosol generated by such generators be proportioned to the size of the reactor furnace.

Inert carrier gas source 14 typically comprises a gas tank or chamber containing inert gas or gas mixture, such as but not limited to $N_2$ and Ar. Other inert gases and mixtures thereof known in the art may also be utilized in the present invention. As shown in FIG. 1, inert carrier gas source 14 is connected to chamber 24 by connection system 18 comprising tubes, connected chambers, pipes, or other delivery mechanisms known in the art, and disposed between source 14 and chamber 24. The carrier gas is injected into aerosol chamber 24 (containing liquid boron precursor 32) at inlet 38' or 38'' as depicted in FIG. 2. If multiple chambers 24 and/or sources 14 are utilized, more inlets may be used. It is preferred that at least two inlets or one valved inlet (wherein precursors and various inert gas flows may alternately be blocked or allowed passage past the valve, thereby alternating flow of precursor or inert gas into the chamber) be available and/or used to provide for a suitable flow of the carrier gas, accommodating differing aerosol densities within the aerosol chamber. Spacing between inlets need not be uniform, but may vary. Varied spacing may be useful for different inlet purposes. For example, on a multiple-inlet chamber (such as depicted in FIG. 2), bottom inlet 38 is typically used to batch transfer the precursor into the chamber. Upper inlets 38', 38'' may be used for flow of carrier gas to mix with different density levels of aerosol (e.g., the lower the height of the aerosol within the chamber, the higher the density of the aerosol). The carrier gas serves to transport aerosol droplets of precursor 32 into furnace 20, by carrying the aerosol droplets through connection system 18', disposed between chamber 24 and furnace 20. Preferably, the flow rate of the carrier gas through connection system 18' corresponds to the flow rate of the carrier gas through connection system 18.

Nitriding gas source 16 typically comprises a gas tank or chamber containing a nitrogen-containing gas or gas mixture known in the art, preferably $NH_3$. The nitrogen-containing gas mixture may comprise a liquid or solution suitable for nitriding that is aerolized and therefore utilizes an inert carrier gas for flow into the furnace. Nitriding gas source 16 is connected to furnace 20 by connection system 18''. In alternate embodiments, connection system 18''', as depicted in FIG. 1, additionally flows from inert carrier gas source 14 to furnace 20, for direct flow of the inert gas into furnace 20. While this is not critical to the AAVS process described herein, it is helpful in the process, for example, in maintaining a gas flow pressure to "push" the remaining aerosol into the furnace after the aerosol generator has been turned off, thereby stopping its pressured flow.

Connection systems 18', 18'', 18''' join to a gas tight end cap disposed in the proximate end of furnace tube 40 of furnace 20. The carrier gas, carrying the aerosol droplets, flows through connection system 18' into tube 40. Preferably, at essentially the same time, the nitriding gas is separately injected into furnace tube 40 through connection system 18'' at a flow rate preferably approximately proportional to the flow rate of carrier gas. In alternate embodiments, different flow rates may be utilized. The flow rate may comprise a flow proportion of between approximately 10:1 of $NH_2$:$NH_3$ to approximately 1:20 of $NH_2$:$NH_3$ It is preferred, however, that the flow rate comprise a flow proportion of between approximately 1:1 of $N_2$:$NH_3$ to approximately 1:10 $N_2$:$NH_3$. The nitriding gas mixes inside reactor tube 40 with the aerosol droplets of boron precursor liquid 32, leading to a series of reactions which form particles of $BN_xO_yC_z$, the boron nitride precursor intermediate structure as more completely described infra. The particles of $BN_xO_yC_z$ will preferably exhibit spherical shape provided the aerosol droplets are formed and the furnace is heated.

All connection systems 18, 18', 18'', 18''' may comprise tubes, connected chambers, pipes, or other delivery mechanisms known in the art. Connection systems may additionally comprise valves for blocking and/or controlling the flow of the carrier gas, as well as check valves to prevent backward flow. Further, connection systems may comprise joints (e.g., elbow joints), connectors (e.g., T-connectors), and affixing means known to the art (e.g., threaded insertion ends, couplings, etc.), as well as multiple flow lines per each system (e.g., when multiple inlets or outlets are used on connected structures). Finally, the connection systems may additionally comprise mechanical or computerized gauge and check systems for monitoring and controlling the flow of gas manually or automatically which may be interconnected with any mechanical or computerized gauge and and/or check systems for monitoring and controlling the furnace temperature and gas volume within the furnace.

Figure 6:
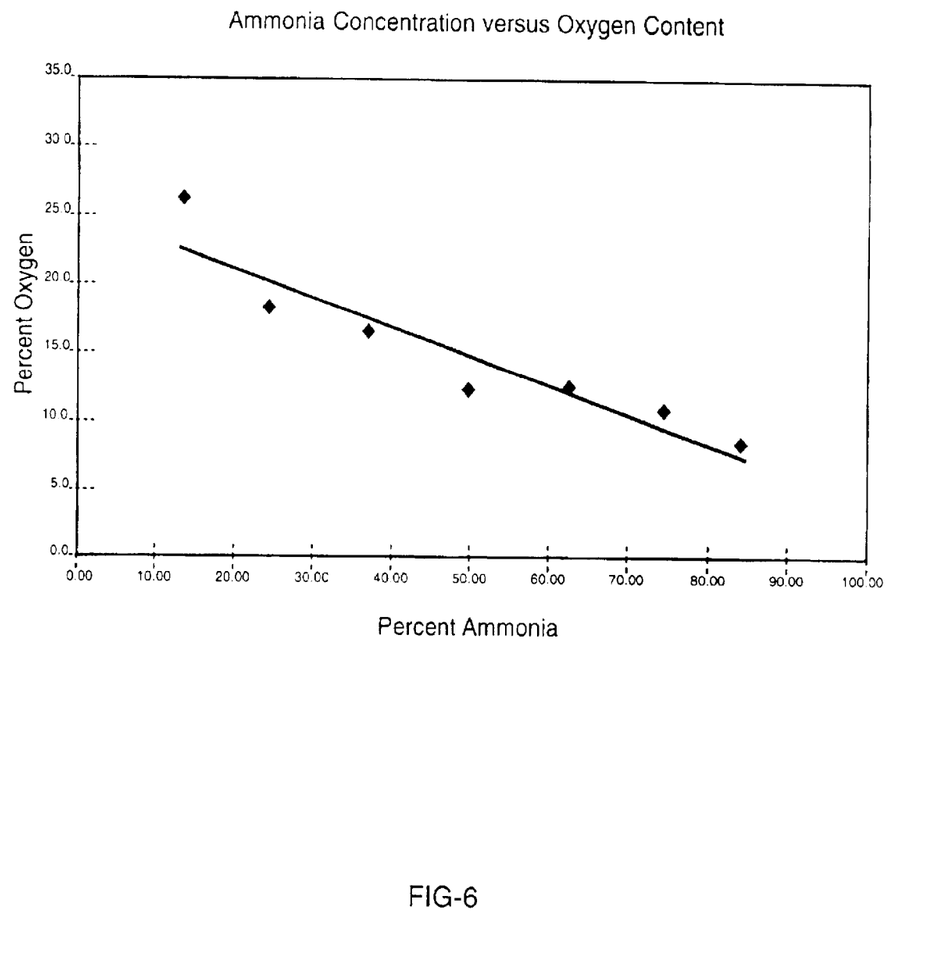
FIG. 6 is a line graph depicting $BN_xO_yC_z$ Powder Oxygen Concentration (% wt.) v % $NH_3$ in $N_2$ Gas Flow (Total flow rate=approximately 4 L/min) at 1400° C.

Flow for both the nitriding gas source and the inert carrier gas source may comprise a wide range of flow rates that are generally at least somewhat dependent on the furnace type used. The furnace used may be a commercial or a bench scale model. An example of a bench scale model furnace that may be used is a Lindbergh Model 54779, fitted with a nominal 4" diameter×6' length reactor tube. A preferred combination range for flow rates of the nitriding gas and carrier gas used for this particular bench scale model furnace, including flow rate, is approximately 0.2 L/min $N_2$+approximately 0.2 L/min $NH_3$ to approximately 2 L/min $N_2$+approximately 6 L/min $NH_3$. Other flow rates may be used as discussed supra, especially on commercial scale model furnaces. The most preferred gas mixtures and proportions are ones with $N_2$:$NH_3$ ratios less than 1. Ratios of $N_2$:$NH_3$ greater than 1 typically result in reduced nitriding characteristics (as shown in FIG. 6). Other less preferred reactants that may be utilized as a nitriding source include nitrogen, nitrogen/hydrogen mixtures, alkyl amines, hydrazine, cyanamide, and dicyanamide, hydroxyl amine, or mixtures thereof.

In the preferred method, furnace 20 will be heated to a temperature of between approximately 600° C. and approximately 1800° C., preferably between approximately 1200° C. and approximately 1800° C. This causes reactions between the boron containing aerosol droplets $(RO)_3B$ and the nitriding gas, forming the intermediate precursor product, $BN_xO_yC_z$, as set forth in the following generalized reaction.

where a, b, and c are>0; x, y, z are>0; and R comprises an alkyl group having $C_1$-$C_4$.

The resultant compound may also comprise hydrogen atoms, thereby forming a composition, $BN_xO_yC_zH_q$, however, for the purposes of this application, such a composition is considered to be within the references to the $BN_xO_yC_z$ composition, therefore all references in the description and claims to the $BN_xO_yC_z$ composition are understood to include $BN_xO_yC_zH_q$ compositions.

Figure 3:
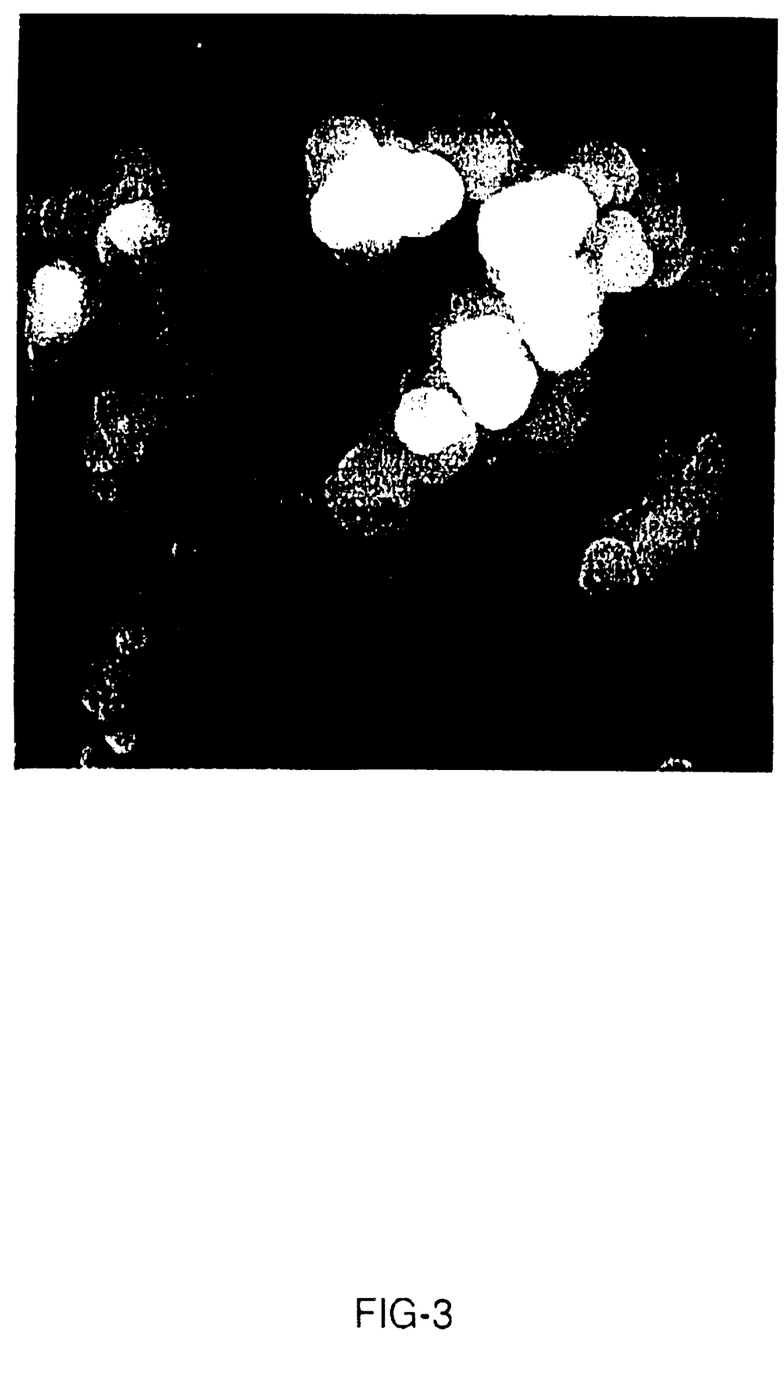
FIG. 3 is a scanning electron microscopy (SEM) micrograph showing the spherical particle shape of the $BN_xO_yC_z$ particles in a sample obtained with a furnace temperature of 1500° C. and flow rates of 0.5 L/min ($N_2$) and 0.5 L/min ($NH_3$)
Figure 4:
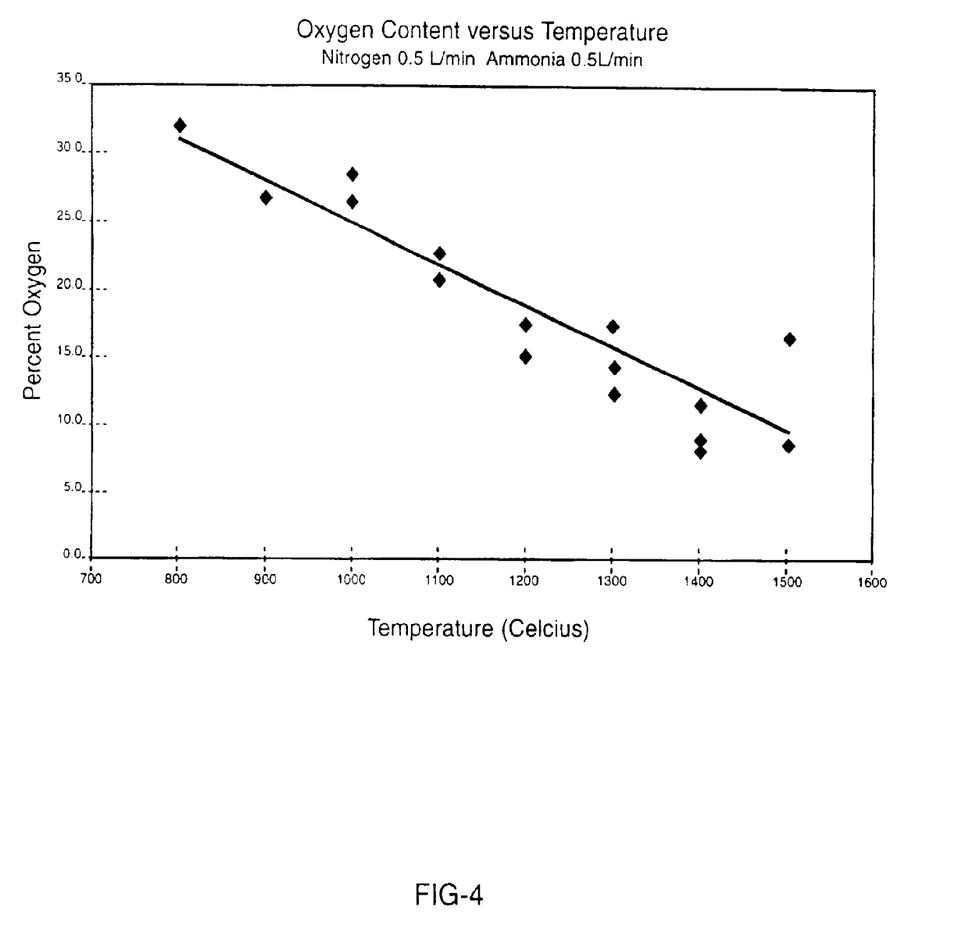
FIG. 4 is a line graph depicting $BN_xO_yC_z$ Powder Oxygen Concentration (% wt.) v. AAVS Process Temperature ($N_2$ is approximately 0.5 L/min, $NH_3$ is approximately 0.5 L/min)

A scanning electron microscopy (SEM) micrograph showing the spherical particle shape of the $BN_xO_yC_z$ particles in a sample obtained with a furnace temperature of 1500° C. and flow rates of 0.5 L/min ($N_2$) and 0.5 L/min ($NH_3$) is shown in FIG. 3; a line graph depicting $BN_xO_yC_z$ Powder Oxygen Concentration (% wt.) v. AAVS Process Temperature under the same conditions is shown in FIG. 4. These spherical precursor particles are carried by the inert carrier/nitriding gas stream through the furnace where the particles are captured on an impact filter, a bag filter assembly, or other known capturing device 41. The filter unit is opened and the powder is collected through conventional methods well known in the art. Collected samples are preferably inserted into another furnace (not shown) for additional nitriding/calcining. This is preferably done in an ammonia-rich (or other nitriding agent rich) atmosphere at a furnace temperature of between 600° C. and 1800° C. to form dense BN particles of spherical shape with an B:N ratio of approximately 1:1, and having a hexagonal or turbostratic structure.

The time and temperature of additional nitridation/calcination and post-nitriding determine the residual oxygen and carbon contents and, consequently, the final degree of crystallinity of the BN product. However, it has been further discovered in accordance with the present invention that the nitridation/calcination time and temperature are inversely proportional. Accordingly, the heat treatment time may be shortened by proportionally raising the nitridation/calcination temperature. The heat treatment step may or may not change the spherical morphology of the BN particles, depending on the nitridation/calcination conditions. It is also possible to skip the collection step and feed the initially produced gas stream containing $BN_xO_yC_z$ powder into a second, separately heated tubular reactor where final nitridation takes place. Finally, it is also possible to use a vertical furnace configuration (with or without counter current gas/aerosol flow) thereby extending the aerosol residence time in the reactor so that spherical morphology or related morphologies are obtained in a single stage, without second stage calcination, to give hexagonal or turbostratic BN. It is possible to perform such a "one-step" reaction in a horizontal furnace as depicted in FIG. 1, however, it is anticipated that the yield will render greater impurities, wherein "impurities" are viewed as BN structures not having a spheriodal structure or additional elements other than boron or nitrogen.

Figure 5:
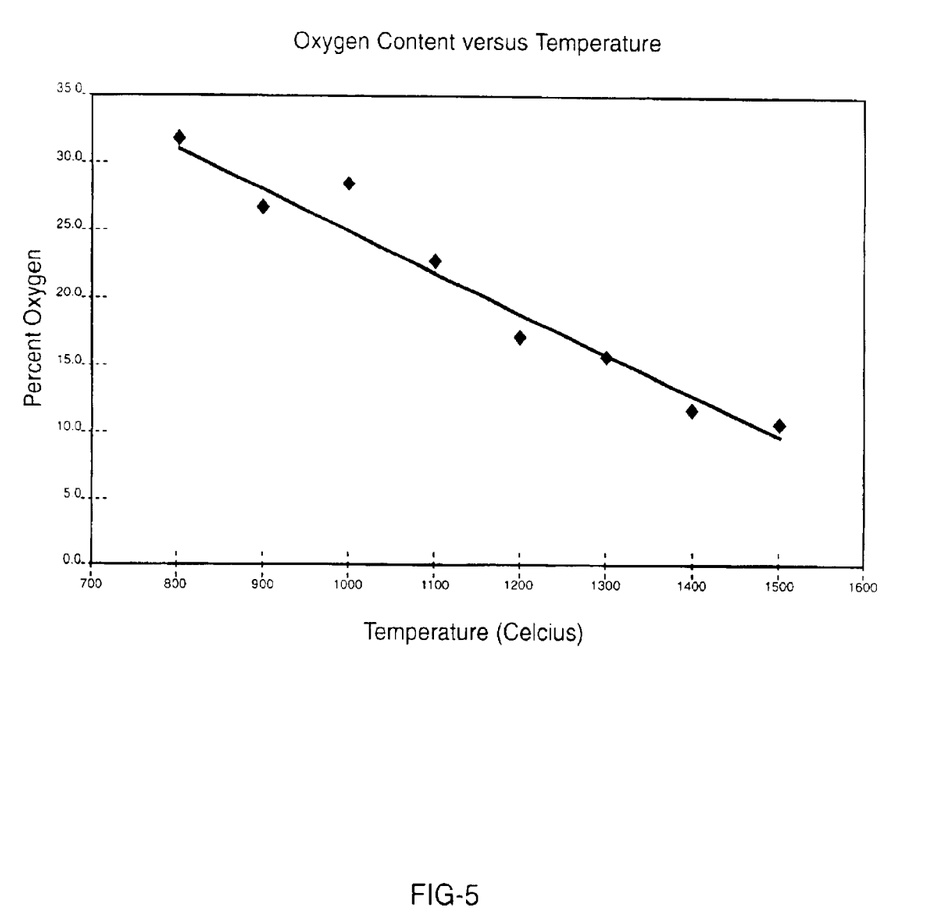
FIG. 5 is a line graph depicting $BN_xO_yC_z$ Powder Oxygen Concentration (% wt.) v. AAVS Process Temperature ($N_2$ is approximately 1 L/min, $NH_3$ is approximately 3 L/min)

As discussed above, the temperature of the furnace in the AAVS (during the first heating step, stage 1) affects the powder O and C contents. For example, temperatures below 600° C. produce high O and C contents and irregular particle morphology. At 600° C., spherical powders with O content of approximately 40 wt. % and C content of approximately 1% are typically produced. The oxygen content then dramatically decreases with increasing reactor tube temperature above 600° C. (as shown in FIG. 4, depicting a series of typical experiments performed between 800° C. and 1500° C. with $N_2$ flow rate of 0.5 L/min and $NH_3$ flow rate of 0.5 L/min). When the reactor atmosphere is richer in $NH_3$, the oxygen content of the $BN_xO_yC_z$ powder also decreases with increasing reactor tube temperature as shown in FIG. 5 (where $N_2$ was approximately 1 L/min, and $NH_3$ was approximately 3 L/min) despite the concomitant shorter aerosol residence times.

The flow rate of the gases can also be varied with flow controllers 44, as depicted in FIG. 1, to alter the residence time of the particles in the furnace and/or to change the mole fraction of the primary nitriding gas, $NH_3$, relative to the carrier gas, $N_2$. The flow rates can be either increased or decreased depending on the residence time desired. For example, as shown in FIG. 6, when the reactor tube temperature is held at 1400° C. and total gas flow rate is set at 4 L/min, as the $NH_3$ mole fraction increases, the weight percent oxygen of the resulting $BN_xO_yC_z$ drops off dramatically from about 26% to less than 10%. Similar trends appear with other reactor temperatures. Therefore, a ratio of $N_2$:$NH_3$ less than or equal to 1 is preferred. However, in alternate embodiments, ratios greater than 1 may be utilized in order to make a $BN_xO_yC_z$ having higher oxygen and carbon contents, when desired.

The need for the use of a "second" heating step to further nitride the $BN_xO_yC_z$ powder when a "purer" BN end product is desired is shown by $BN_xO_yC_z$ powder characterization by bulk elemental analysis, X-ray diffraction (XRD) and scanning electron microscopy (SEM). These data confirm that the Stage 1 (after the first heating step) AAVS runs produce spherical morphology $BN_xO_yC_z$ powders that have a low degree of crystalline order or are turbostratic.

Therefore, in order to remove the remaining O and C impurities and increase the powder crystallinity, the $BN_xO_yC_z$ powders are preferably nitrided further under $NH_3$, as shown in the following generalized reaction:

where a, b, and c are>0; x, y, and z are≧0; and combustion products, for example $CO_2$ and CO, may result.

In the preferred method, the $BN_xO_yC_z$ powders are collected from the tube furnace and placed in a second furnace (or the powder is not collected and the powder entrained on a gas stream is simply vented to the second furnace), or are subjected to an additional run in the original furnace. (See Example 1, infra.) Additional carbon can be added to assist with the O replacement via carbothermal reduction, if desired. This carbon addition may be accomplished, for example, by addition of higher R value $(RO)_3B$ compounds as the precursor, addition of alkane, or arene compounds in the aerosol feed stream, or by addition of carbon powder to the $BN_xO_yC_z$ powder.

Figure 7:
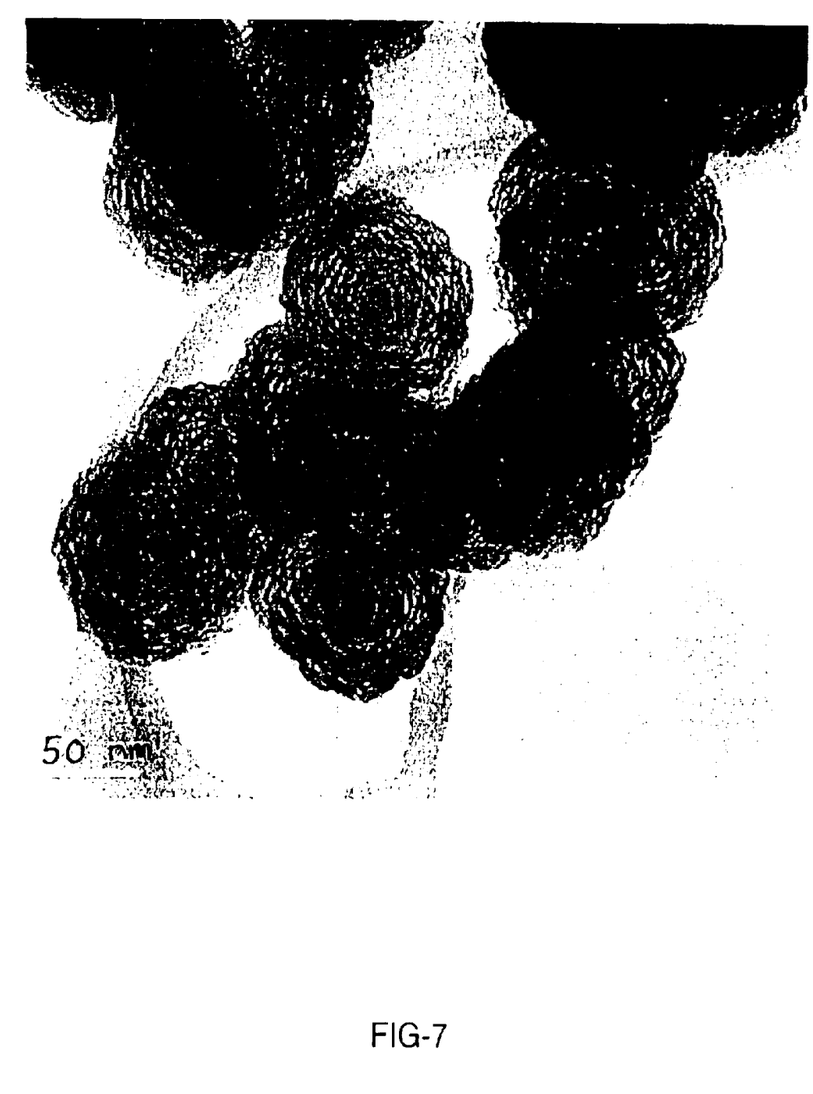
FIG. 7 is a TEM of BN Powder Formed in Second Stage at 1600° C., Showing Roughened Spherical Particles.

The nitriding conditions of this method may be varied in order to obtain particles that have morphologies that include but are not limited to smooth spherical particles that have a turbostratic structure, "textured" or bladed surface roughened spherical particles (See FIG. 7, TEM of BN Powder Formed in Second Stage at 1600° C.), "fuzzy" spherical particles having crystalline whisker growth on the primary particle surfaces, "bladed" spherical morphology particles where the blades are highly ordered h-BN or fully platelet morphology particles that have the h-BN crystal structure. Variations in aerosol precursor, aerosol generation, aerosol processing, and reactor conditions (Stage I) and subsequent powder nitridation (Stage II) allow for the formation of alternative products in addition to the dense spherical particles described above. For example, $BN_xO_yC_z$ powders produced at lower temperatures and/or with lower relative amounts of nitriding gas, $NH_3$, and/or lower residence times have higher concentrations of oxygen (35–20%). These powders tend to form melts at modest temperatures between approximately 500° C. to approximately 1200° C. that can be processed in Stage II nitridation to form powder agglomerates, coated substrates or fiber/whisker materials. (See Examples 2, 3, 4, infra.)

Additionally, the nitridation conditions may also be varied in order to affect final powder density, surface area and microporosity. The amount of carbon in the $BN_xO_yC_z$ can be conveniently varied by changing R in $(RO)_3B$ as well as nitridation conditions in Stage 1. The resulting nano-dispensed carbon can be nitrided with ammonia (Stage II) providing microporous or nanoporous powder particles with variable surface areas (e.g., 20–500 m$^2$/g) and porosities. (See Example 5, infra.)

Further, valuable thin films of BN may be produced by grinding the $BN_xO_yC_z$ particles, spreading them over an oxide substrate (or alternatively, the particles may be collected directly on a substrate) and reacting and melting them into a BN film. (See Example 3, infra.)

In addition to the preferred method described supra, in alternate embodiments, the $(RO)_3B$ reagents may be dissolved in liquid $NH_3$ solution and this solution used to form an aerosol (although such a process uses far greater amounts of ammonia). (Lindquist, DA et al. Boron Nitride Powders Formed by Aerosol Decomposition of Poly(borazinylamine) Solutions. *J. Am. Ceram. Soc.* 74 (12 3126–28, 1991.) Using a dissolved precursor (in ammonia) may help avoid possible agglomeration of sub-micron particles when the precursor is introduced into a hot reactor. Such agglomerations may interfere with formation of the $BN_xO_yC_z$ structure. Similarly, the adduct $(MeO)_3B.NH_3$ may be useful to use as a precursor, as well as azeotropic mixtures of alkylborates and alcohols, most preferably, an azeotrope of trimethylborate and methanol. It is understood that while most commercially available azeotropic mixtures comprise a "parent" group, in this case an alkyl group, wherein the alkyl group of the alcohol and other member of the azeotrope comprise the same parent group (e.g., MeOH and $(MeO)_3B$), it is possible to utilize azeotropes having mixtures wherein the parent group may not "match" the corresponding portion of the other member (e.g., $(EtO)_3B$ and (MeOH). Further, azeotropic mixtures may comprise multiple members, for example, in this case, MeOH, EtOH, and $(MeO)_3B$. All these potential azeotropes are within the scope of the present invention.

Additionally, alternate embodiments of the present invention will include using polyborates, such as boroxines, specifically trimethoxyboroxine, may be introduced to the reactor tube by use of liquid ammonia aerosol for use as the organoboron precursor. For purposes of the present invention, polyborates are defined to be any dealkoxylated or dehydrated boric anhydride precursor in the series from boron alkoxide or boric acid to boric anhydride (i.e., $B(OR_3) \ldots (ROBO)_3 \ldots (ROBO)_6 \ldots B_2O_3$). Polyborates are discussed in detail by Wade et al., Synthesis and Characterization of Processable Polyborate Precursors, *J. Sol-Gel Sci. and Tech.*, 5, 15–25 (1995), which is incorporated herein by reference.

The following examples describe application of the preferred method of the present invention and is used for illustrative purposes only. None of the parameters of the examples used are intended to further limit the specification or claims in any fashion.

EXAMPLE 1

Twenty five grams of $(MeO)_3B$ was added to the aerosol generation chamber shown in FIG. 2. The chamber was then placed over the transducer in a Holmes humidifier base unit. The unit was turned on and its transducer causes ultrasonic agitation of the diaphragm at the base of the aerosol chamber. The resulting agitation of the liquid $(MeO)_3B$ generated an aerosol mist of $(MeO)_3B$. Some of this mist was swept into the horizontal furnace tube by a stream of $N_2$ gas (1 L/min) where it was mixed with $NH_3$ vapor (3 L/min), added separately. The aerosol vapor (~1.25 g/min) was carried through the reactor tube and held at a temperature of 1400° C. The resulting $BN_xO_yC_z$ powder (~0.3 g/min) was collected over a 15 minute interval on an impact filter on the exit end of the reactor. The chemical yield was 95% of a powder containing 5–10% oxygen and 1% carbon with a smooth spherical morphology.

The collected $BN_xO_yC_z$ powder (2 g) was placed in a boron nitride crucible and the sample and pyrolysis tube were purged with a slow (0.5 L/min) flow of $NH_3$. The sample was then heated to 1600° C. at a ramp rate of 4° C. and held at this temperature for 3 hours. The powder contained 1% or less oxygen and<0.1% carbon.

EXAMPLE 2

$BN_xO_yC_z$ powder was prepared as described in example 1 with the exception that the $NH_3$ vapor utilized comprised a flow rate of 0.5 L/min. The aerosol vapor (~0.1 g/min) was carried through the reactor tube, held at a temperature of 800° C. The resulting $BN_xO_yC_z$ powder (~0.1 g/min) was collected on an impact filter on the exit end of the reactor. The oxygen content of the powder was higher than in Example 1, 35–40 wt %

Subsequent pyrolysis of the $BN_xO_yC_z$ powder in a closed-end BN crucible (limiting $NH_3$ exposure) with the nitriding gas as $NH_3$ at a flow rate of 0.2 L/min over the powder, with a temperature of 1700° C. for 4 hours lead to agglomeration of the spherical primary BN particles.

EXAMPLE 3

$BN_xO_yC_z$ powder was prepared as described in Example 2 and ground with a mortar and pestle. The resulting ground solid was applied as a dry coating to oxide substrates (e.g. MgO, $Al_2O_3$, $ZrO_2$) and the resulting articles were heated to 1200° C. under $NH_3$ (0.2 L/min). In the heating process, the $BN_xO_yC_z$ formed a melt phase, coating the oxide substrate. Heating was continued at 1200° C. (under constant $NH_3$ flow) and produced thin film BN coatings on the substrate.

EXAMPLE 4

$BN_xO_yC_z$ powder was prepared as described in Example 1, with the exception of the inclusion of small amounts of $Ca(NO_3)_2$ (0.1–1%) to the aerosol, wherein the $BN_xO_yC_z$ powder retained $Ca^{2+}$ highly dispersed within. Subsequent pyrolysis of the $BN_xO_yC_z$ powder at 1700° C. and otherwise as described in Example 2 lead to the growth of whiskers from the surface of spherical primary particles.

EXAMPLE 5

$BN_xO_yC_z$ powder was prepared as described in Example 4. Subsequent pyrolysis of the $BN_xO_yC_z$ powder in a open-end BN crucible (constant exposure to $NH_3$, as opposed to the pyrolysis step in Example 2) with the nitriding gas as $NH_3$ at a flow rate of 0.5 L/min over the powder, with a temperature of 1700° C. for 4 hours lead to submicron sized platelets of BN.

EXAMPLE 6

$BN_xO_yC_z$ powder was prepared as described in Example 1 except that $(EtO)_3B$ was used as the boron precursor source. The resulting $BN_xO_yC_z$ powder (~0.3 g/min) was collected over a 15 minute interval on an impact filter on the exit end of the reactor. The powder contained 5–15% oxygen and 2–8% carbon.

The collected $BN_xO_yC_z$ powder (2 g) was placed in a boron nitride crucible and the sample and pyrolysis tube were purged with a slow (0.5 L/min) flow of $NH_3$. The sample was then heated to 1600° C. at a ramp rate of 4° C. and held at this temperature for 3 hours. The powder contained<1% oxygen and<0.5% carbon with spherical morphology. In contrast to powders from Example 1, these powders displayed higher surface areas (50–200 $m^2/g$), and higher porosities resulting from micro- and nano-porosity (left from loss of carbon).

The preceding examples can be repeated with similar success by substituting the generically or specifically described reactants and/or operating conditions of this invention for those used in the preceding example.

Variations on the above described system which is primarily designed to provide boron nitride powders with dense, spherical morphology primary particles, have been explored. In particular, it is observed that precursors obtained directly from the reaction of $(RO)_3B$ and $NH_3$ in the above described reactor, or from the reaction of $(RO)_3B$ and liquid ammonia followed by aerosol processing of the resulting liquid or from thermal treatment of the adduct, $(MeO)_3B.NH_3^8$, with $NH_3$ (or from the reaction of the azeotropes of $(RO)_3B/ROH$ and $NH_3$) may be used to form $BN_xO_yC_z$ particle agglomerates, films, fibers, whiskers, tubules, microporous powders and bodies and nanoporous powders and bodies.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A method of forming a boron-nitrogen-oxygen-carbon-hydrogen, $BN_xO_yC_z$, precursor for BN comprising:
   providing an organoboron precursor alone or in non-aqueous solution, an inert carrier gas, and a nitriding agent; aerosolizing the organoboron precursor;
   introducing the carrier gas into a chamber containing the aerosolized precursor and forming a combined gas stream;
   sweeping the combined gas stream into a heated furnace;
   injecting the nitriding agent into the furnace;
   allowing the nitriding agent and aerosolized precursor to react to form a powder of a boron-nitrogen-oxygen-carbon-hydrogen composition; and
   collecting the powder.

2. The method of claim 1 wherein the nitriding agent and the aerosolized precursor react in a first heating step.

3. The method of claim 2 wherein the boron-nitrogen-oxygen-carbon-hydrogen composition is heated in a second heating step in the presence of a nitriding agent, inert gas, or vacuum.

4. The method of claim 1 wherein the nitriding agent comprises members selected from the group consisting of $NH_3$, $NH_2$, $N_2$, alkylamines, hydrazine, cyanamide, dicyanamide, and mixtures thereof.

5. The method of claim 1 wherein the organoboron precursor agent comprises an alkylborate.

6. The method of claim 5 wherein the alkylborate comprises a trialkylborate.

7. The method of claim 6 wherein the trialkylborate comprises $(MeO)_3B$, $(EtO)_3B$, $(PrO)_3B$, $(BuO)_3B$, and mixtures thereof.

8. The method of claim 1 wherein the organoboron precursor agent comprises a polyborate.

9. The method of claim 8 wherein the polyborate comprises a boroxine.

10. The method of claim 1 wherein the organoboron precursor comprises an azeotropic mixture.

11. The method of claim 10 wherein the azeotropic mixture comprises an alkylborate and an alcohol.

12. The method of claim 11 wherein the alkylborate comprises a trimethylborate and wherein the alcohol comprises methanol.

13. The method of claim 1 wherein said organoboron precursor is dissolved in simple alcohols, alkanes, or arenes prior to aerosolization, thereby increasing the percentage of carbon in the resulting $BN_xO_yC_z$ powder.

14. The method of claim 1 wherein said organoboron precursor is dissolved in liquid ammonia prior to aerosolization.

15. The method of claim 1, wherein the nitriding agent comprises a liquid, and wherein the liquid is aerosolized and is swept into the furnace by a carrier gas.

16. The method of claim 1 wherein the combined gas stream and carrier gas and the nitriding agent are simultaneously swept or injected into the furnace.

17. The method of claim 1 wherein the flow of the combined gas stream has a predetermined flow rate.

18. The method of claim 1 wherein the injection of the nitriding agent has a predetermined flow rate.

19. The method of claim 1 wherein the step of heating the furnace comprises the step of maintaining a temperature of between approximately 600° C. and approximately 1800° C.

20. The method of claim 19 wherein the temperature maintained is between approximately 1200° C. and approximately 1800° C.

21. The method of claim 1 wherein the boron-nitrogen-oxygen-carbon powder is collected on a powder collection device.

22. The method of claim 21 wherein in the collection step the boron-nitrogen-oxygen-carbon-hydrogen-powder is collected on a filter.

23. The method of claim 1 comprising the additional steps of grinding the resultant $BN_xO_yC_z$ powder, spreading the powder over an oxide, and melting the powder over the oxide thereby reacting the powder with the oxide and forming a BN thin film layer.

24. The method of claim 1 comprising the following additional steps:

collecting the powder on a substrate; and melting the powder over the substrate thereby forming a BN thin film layer.

25. A method for preparing h-BN comprising:

providing an organoboron precursor alone or in non-aqueous solution, an inert carrier gas, and a nitriding agent; aerosolizing the organoboron precursor;

introducing the carrier gas into a chamber containing the aerosolized precursor and forming a combined gas stream;

sweeping the combined gas stream into a heated furnace;

injecting the nitriding agent into the furnace;

allowing the nitriding agent and aerosolized precursor to react to form a powder of a boron-nitrogen-oxygen-carbon-hydrogen composition during a first heating step;

heating the boron-nitrogen-oxygen-carbon-hydrogen composition in a second heating step in the presence of the nitriding agent;

forming a boron-nitrogen-oxygen-carbon-hydrogen composition by allowing the nitriding agent and the boron-nitrogen-oxygen-carbon-hydrogen composition to react with the nitriding agent in the second heating step; and collecting the powder.

26. The method of claim 25 wherein the nitriding agent comprises a member selected from the group consisting of $NH_3$, $NH_2$, $N_2$, alkylamines, hydrazine, cyanamide, dicyanamide, and mixtures thereof.

27. The method of claim 25 wherein the organoboron precursor agent comprises a alkylborate.

28. The method of claim 25 wherein the organoboron precursor agent comprises a trialkylborate.

29. The method of claim 28 wherein the trialkylborate comprises a member selected from the group consisting of $(MeO)_3B$, $(EtO)_3B$, $(PrO)_3B$, or $(BuO)_3B$, and mixtures thereof.

30. The method of claim 25 wherein the organoboron precursor agent comprises a polyborate.

31. The method of claim 30 wherein the polyborate comprises a boroxine.

32. The method of claim 25 wherein the organoboron precursor comprises an azeotropic mixture.

33. The method of claim 32 wherein the azeotropic mixture comprises an alkylborate and an alcohol.

34. The method of claim 33 wherein the alkylborate comprises a trialkylborate and wherein the alcohol comprises methanol.

35. The method of claim 25 wherein said organoboron precursor is dissolved in simple alcohols, alkanes, or arenas prior to aerosolization.

36. The method of claim 35 wherein said resultant boron-nitrogen compound is microporous or nanoporous.

37. The method of claim 25 wherein said organoboron precursor is dissolved in liquid ammonia prior to aerosalization.

38. The method of claim 25, wherein the nitriding agent comprises a liquid, and wherein the liquid is aerosolized and is swept into the furnace by a carrier gas.

39. The method of claim 25 wherein the aerosolized precursor and carrier gas and the nitriding agent are simultaneously swept or injected into the furnace.

40. The method of claim 25 wherein the flow of the combined gas stream has a predetermined flow rate.

41. The method of claim 25 wherein injection of the nitriding agent ahs a predetermined flow rate.

42. The method of claim 25 wherein in the first heating step the temperature maintained is between approximately 1200° C. and approximately 1800° C.

43. The method of claim 42 wherein in the first heating step the temperature maintained is between approximately 1200° C. and approximately 1800° C.

44. The method of claim 25 comprising an additional collecting step wherein the boron-nitrogen-oxygen-carbon-hydrogen powder is collected on a collection device.

45. The method of claim 44 wherein the boron-nitrogen-oxygen-carbon-hydrogen-powder is collected on a filter.

46. The method of claim 44 comprising the following additional steps:

placing the collected boron-nitrogen-oxygen-carbon-hydrogen powder in a second furnace; and subjecting the powder to the second heating step in the second furnace.

47. The method of claim 25 comprising the additional steps of venting a gas stream entrained with the boron-nitrogen-oxygen-carbon-hydrogen powder into a second furnace before the second heating step.

48. The method of claim 25 wherein both heating steps are performed in one furnace.

49. The method of claim 48 wherein the one furnace is a vertical furnace.

50. The method of claim 25 wherein the second heating step comprises maintaining the temperature between approximately 600° C. and approximately 1800° C.

51. The method of claim 50 wherein in the second heating step the temperature is maintained between approximately 1200° C. and approximately 1800° C.

52. The method of claim 25 wherein modified h-BN particles are formed by varying the aerosol conditions or reactor conditions to form turbostratic structures, bladed spherical particles, platelet particles, or particles having crystalline whisker growth.

53. The method of claim 25 wherein the formed BN particles comprise a diameter range between approximately 0.05 $\mu$m and approximately 100 $\mu$m.

* * * * *